(12) United States Patent
Konda et al.

(10) Patent No.: US 9,167,698 B2
(45) Date of Patent: Oct. 20, 2015

(54) SURFACE MOUNT CLIP

(75) Inventors: Kenji Konda, Nagoya (JP); Tomohisa Kurita, Nagoya (JP); Hiroki Kitano, Nagoya (JP); Tatsuya Nakamura, Nagoya (JP); Hideo Yumi, Nagoya (JP)

(73) Assignee: Kitagawa Industries Co., Ltd., Inazawa-shi, Aichi (JP)

( * ) Notice: Subject to any disclaimer, the term of this patent is extended or adjusted under 35 U.S.C. 154(b) by 404 days.

(21) Appl. No.: 13/807,480

(22) PCT Filed: Jun. 30, 2011

(86) PCT No.: PCT/JP2011/065079
§ 371 (c)(1),
(2), (4) Date: Feb. 4, 2013

(87) PCT Pub. No.: WO2012/002503
PCT Pub. Date: Jan. 5, 2012

(65) Prior Publication Data
US 2013/0206457 A1    Aug. 15, 2013

(30) Foreign Application Priority Data

Jun. 30, 2010    (JP) .................................. 2010-150021

(51) Int. Cl.
*H05K 1/18* (2006.01)
*H05K 9/00* (2006.01)
(Continued)

(52) U.S. Cl.
CPC .............. *H05K 1/181* (2013.01); *H05K 9/0035* (2013.01); *F16B 5/0635* (2013.01); *F16B 21/073* (2013.01)

(58) Field of Classification Search
USPC .................. 439/775, 834, 863, 553, 613, 510
See application file for complete search history.

(56) References Cited

U.S. PATENT DOCUMENTS 3,369,210 A * 2/1968 Menickella ..................... 439/32
4,890,199 A * 12/1989 Beutler ......................... 361/818
5,043,528 A * 8/1991 Mohr ............................. 174/355
(Continued)

FOREIGN PATENT DOCUMENTS

CN    101242735 A    8/2008
JP    11 339 906 A    12/1999
(Continued)

OTHER PUBLICATIONS

International Search Report With English Translation.
(Continued)

*Primary Examiner* — Alexander Gilman
(74) *Attorney, Agent, or Firm* — Davis & Bujold, P.L.L.C.; Michael J. Bujold

(57) ABSTRACT

A surface mount clip including: a solder joint part in which a lower surface thereof is to be a solder joint surface to be soldered and connected to a conductor pattern on a printed circuit board. A pair of support parts are connected to the solder joint part and, when the solder joint part is soldered and connected to the printed circuit board, are supported in a position above the printed circuit board at an interval between the pair of support parts. The interval allows a conductive member, other than the printed circuit board, to be inserted therein. A resilient contact part, that is connected at least to one of the pair of support parts, is resiliently deformed and pressed by the conductive member, when the conductive member is inserted between the pair of support parts, and electrically connects the conductor pattern and the conductive member.

10 Claims, 9 Drawing Sheets

(51) Int. Cl.
*F16B 5/06* (2006.01)
*F16B 21/07* (2006.01)

(56) References Cited

U.S. PATENT DOCUMENTS

| | | | |
|---|---|---|---|
| 5,124,889 A * | 6/1992 | Humbert et al. | 361/818 |
| 5,235,492 A * | 8/1993 | Humbert et al. | 361/818 |
| 5,577,268 A * | 11/1996 | Ho et al. | 455/90.3 |
| D410,226 S * | 5/1999 | Yoshiura | D13/133 |
| 6,000,956 A * | 12/1999 | Henningsson et al. | 439/95 |
| 6,077,095 A * | 6/2000 | DelPrete et al. | 439/92 |
| 6,267,629 B1 * | 7/2001 | Nguyen et al. | 439/857 |
| 6,500,012 B1 * | 12/2002 | Billenstein et al. | 439/92 |
| D483,330 S * | 12/2003 | Chen | D13/133 |
| D607,835 S * | 1/2010 | Huang | D13/154 |
| D624,025 S * | 9/2010 | Luo et al. | D13/154 |
| 8,602,811 B2 * | 12/2013 | Takahashi | 439/376 |
| D706,224 S * | 6/2014 | Kimura et al. | D13/154 |
| 8,915,760 B2 * | 12/2014 | Kurita | 439/863 |

FOREIGN PATENT DOCUMENTS

| | | |
|---|---|---|
| JP | 2000 196 280 A | 7/2000 |
| JP | 2003 051 692 A | 2/2003 |
| JP | 2005 332 953 A | 12/2005 |
| JP | 2006 100 473 A | 4/2006 |
| JP | 2008 091 245 A | 4/2008 |
| KR | 100886591 B1 | 3/2009 |
| WO | 2009/057855 A1 | 5/2009 |

OTHER PUBLICATIONS

Chinese Office Action issued in corresponding Chinese Patent Application No. 201180032887.7 mailed Oct. 8, 2014.
Japanese Office Action issued in corresponding Japanese Patent Application No. 2012-522699 mailed Dec. 16, 2014.
Korean Office Action issued in corresponding Korean Application No. 2013-7001929 mailed Dec. 23, 2013.
Chinese Office Action issued in corresponding Chinese Patent Application No. 201180032887.7 dated Apr. 13, 2015.

* cited by examiner

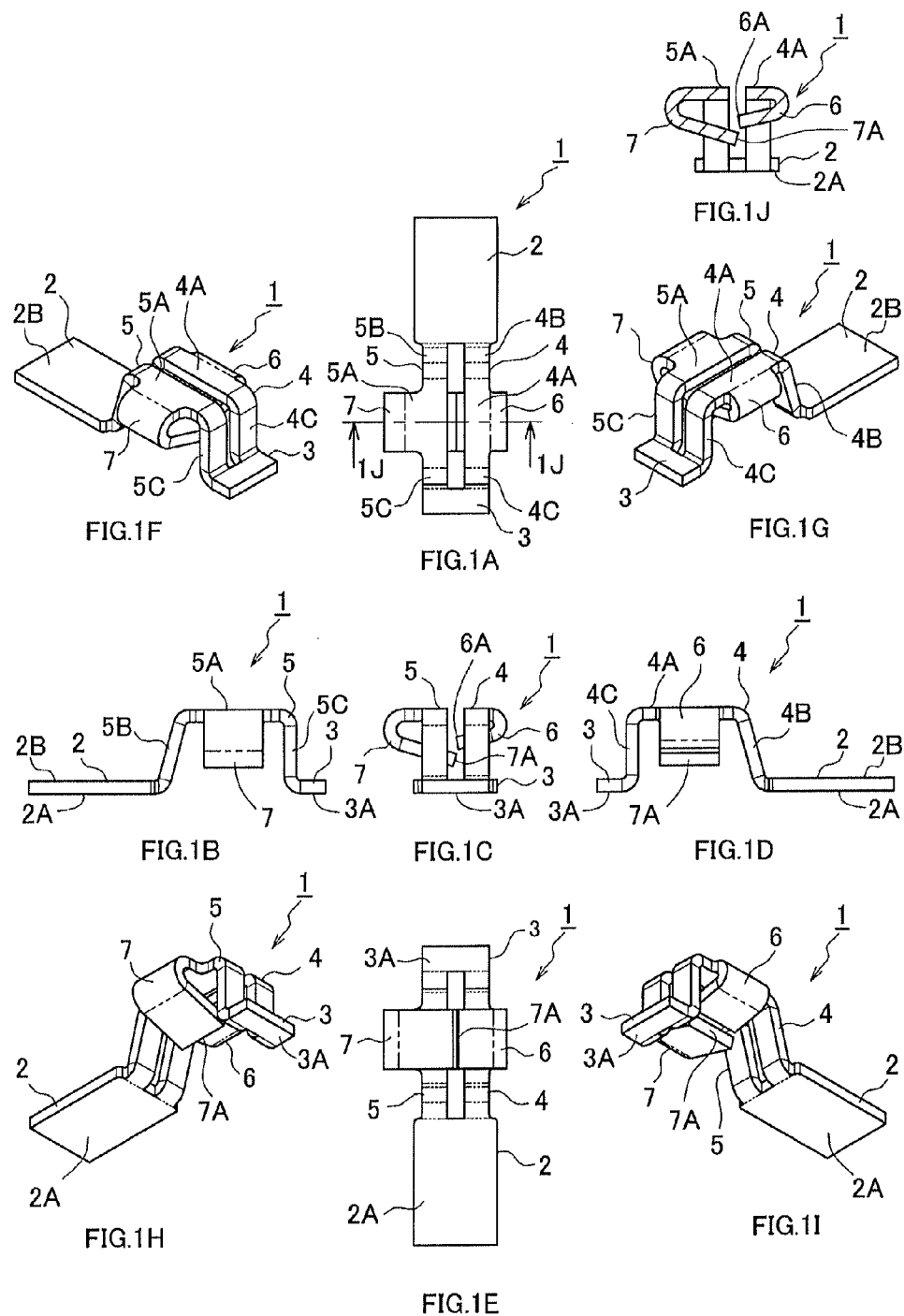

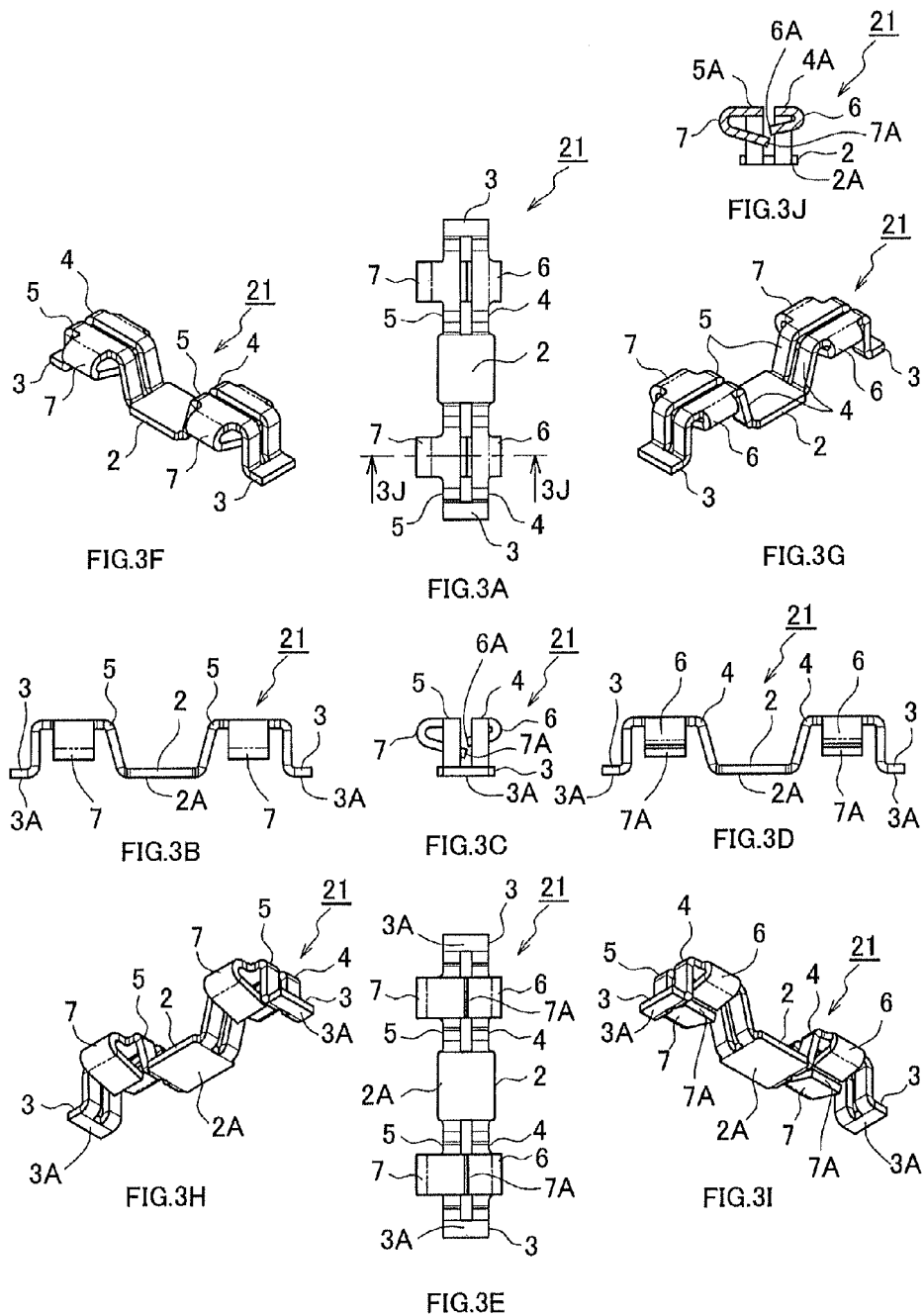

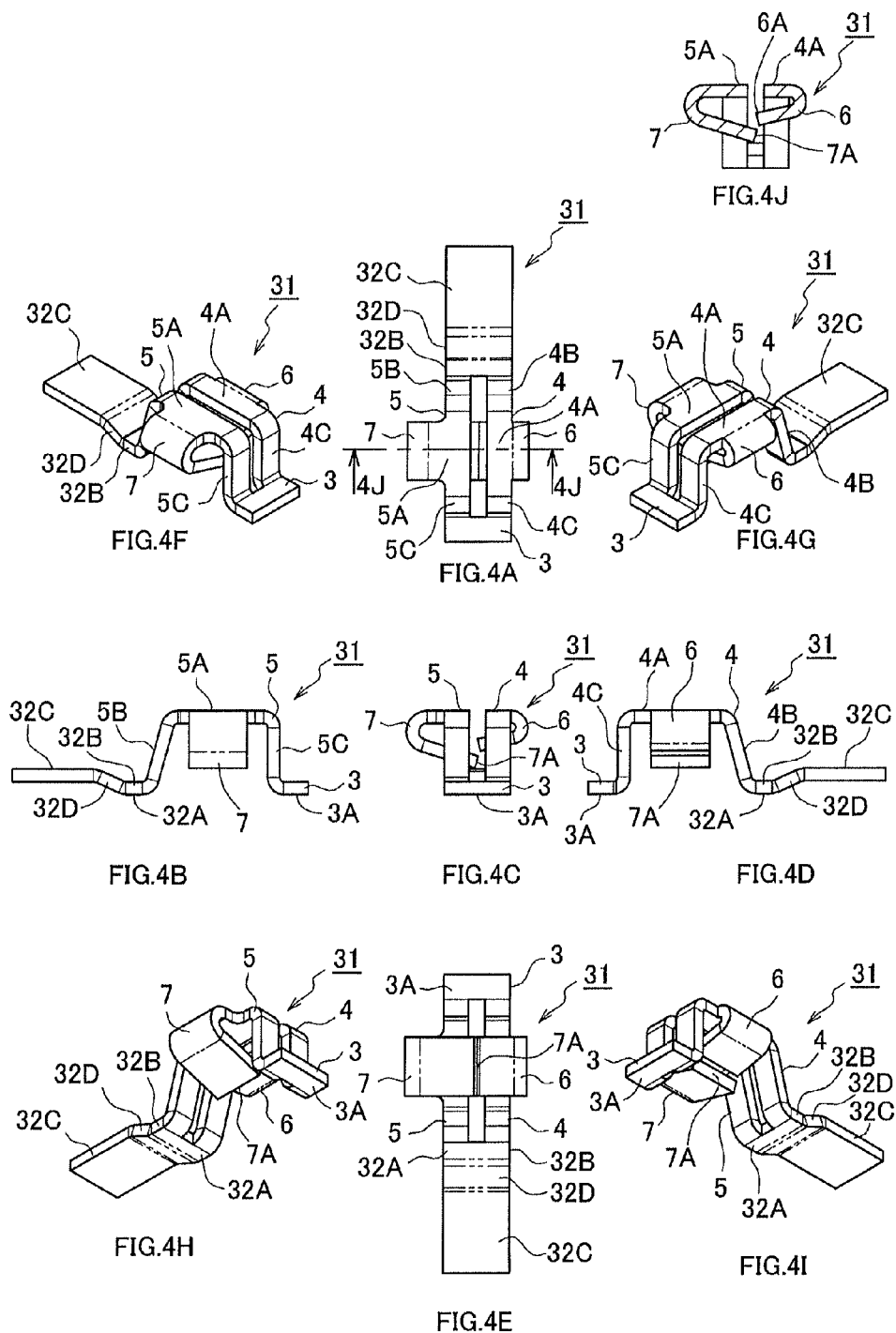

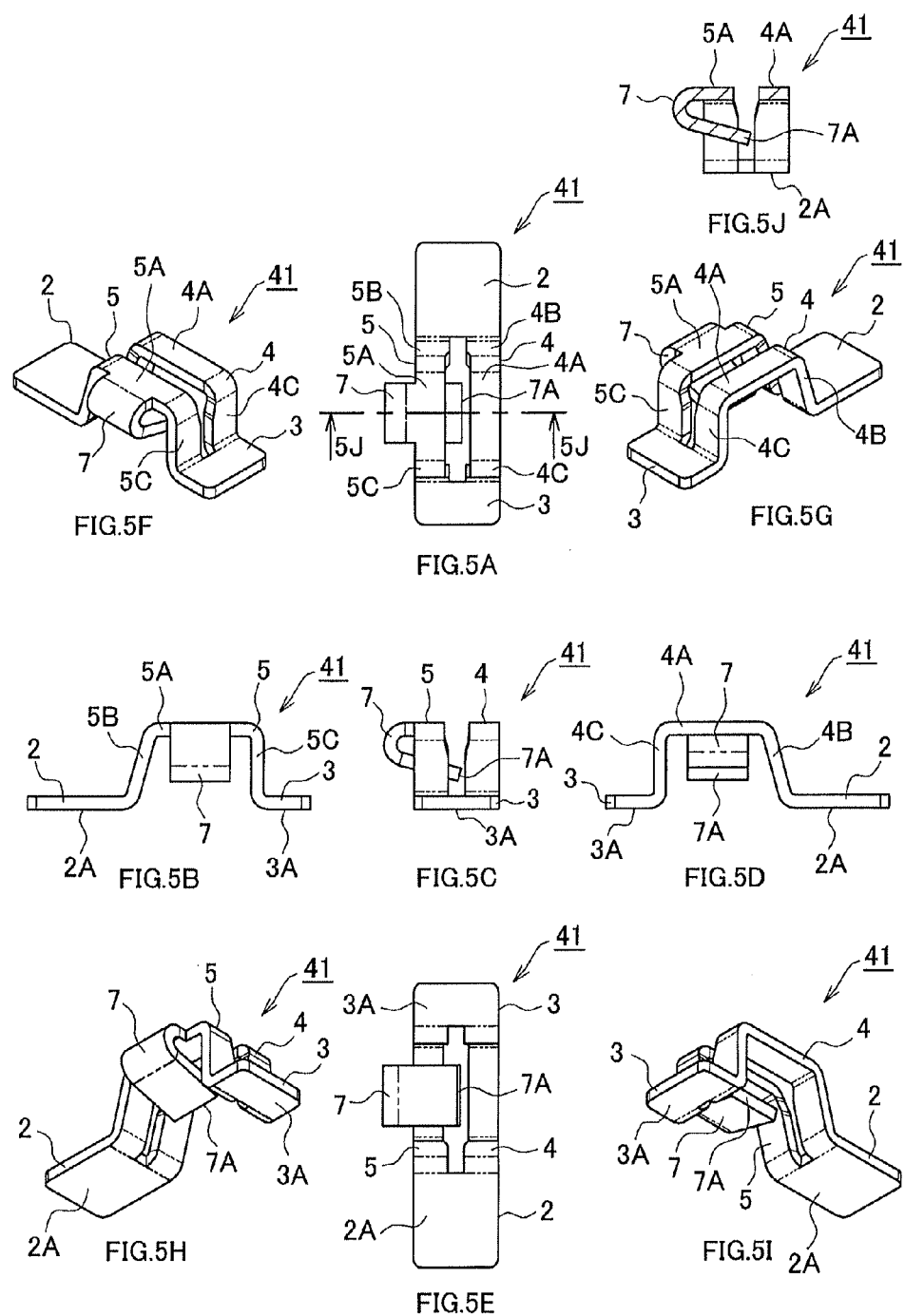

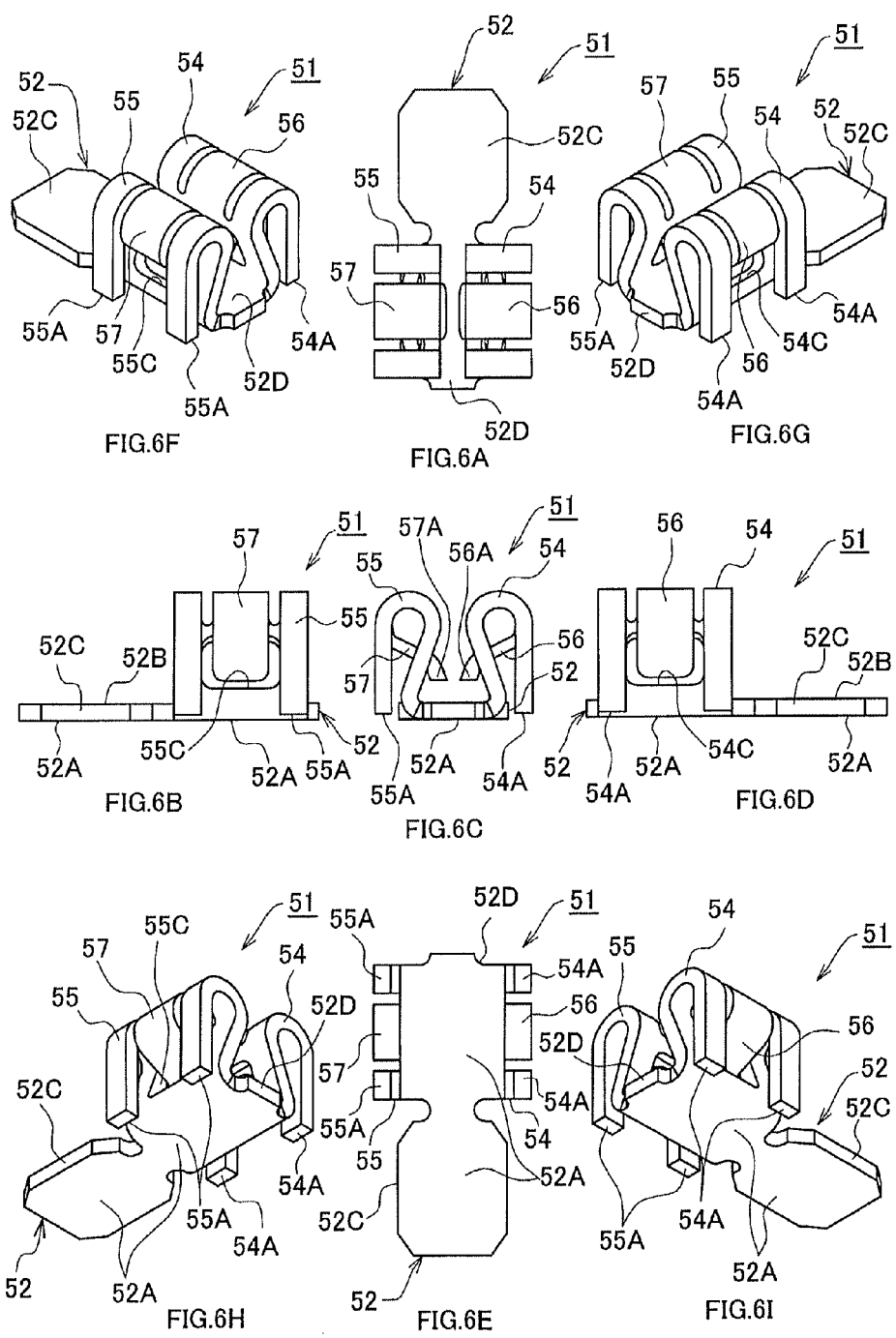

SURFACE MOUNT CLIP

CROSS-REFERENCE TO RELATED APPLICATIONS

This international application claims the benefit of Japanese Patent Application No. 2010-150021 filed on Jun. 30, 2010 in the Japan Patent Office, and the entire disclosure of Japanese Patent Application No. 2010-150021 is incorporated herein by reference.

TECHNICAL FIELD

The present invention relates to a surface mount clip that is to be mounted on an attachment surface of a printed circuit board so as to secure a conductive member other than the printed circuit board (for example, a shielding case), on the printed circuit board.

BACKGROUND ART

Conventionally, in order to secure a conductive member, such as a shielding case, on a printed circuit board, a plurality of surface mount clips is soldered and connected to a conductor pattern surface of the printed circuit board so as to enclose a target IC, and an end edge and the like of an open side of the shielding case is secured to the respective surface mount clips. In this way, an IC can be enclosed by a shielding case maintained at ground electrical potential, and can be protected against noise. For this kind of surface mount clip, a surface mount clip, including a solder joint part and a pair of resilient contact parts, has been suggested. The solder joint part constitutes a lower surface of the surface mount clip and is to be soldered and connected to the above-described conductor pattern. The pair of resilient contact parts is extended from opposed sides of the solder joint part, bent toward a direction of an upper surface of the solder joint parts so as to come close to each other, and clip an end edge of the shielding case therebetween.

However, in some cases of the surface mount clip configured as above, the resilient contact parts are permanently deformed due to the end edge of the shielding case laterally hitting the resilient contact parts, which does not permit the surface mount clip to preferably clip the end edge of the shielding case. Thereupon a technique is proposed (for example, see Patent Document 1) wherein most part of a surface mount clip including resilient contact parts is buried into a printed circuit board, and tongue pieces, formed on an end edge of a shielding case, are inserted and clipped between the buried resilient contact parts.

PRIOR ART DOCUMENT

Patent Document

Patent Document 1: Japanese Unexamined Patent Application Publication No. 2006-100473

SUMMARY OF THE INVENTION

Problems to be Solved by the Invention

However, in a case wherein the surface mount clip is buried into the printed circuit board as disclosed in Patent Document 1, the tongue pieces need to be provided to the shielding case, and the manufacturing cost increases. In addition, the work of inserting the tongue pieces of the shielding case between the resilient contact parts buried into the printed circuit board is difficult, and the work cost increases. Thereupon, a substrate mount connector is proposed (for example, Japanese Patent Application Publication No. 11-339906), although in a completely different field, in which a fitting surface, provided with an opening in the center, is supported in a position above a printed circuit board, and a male terminal, inserted into the opening, is clipped by a pair of resilient contact pieces connected to an inner side of the opening.

However, in order to use such configuration for securing a shielding case, projections need to be provided to the end edge of a shielding case and to be inserted into the opening of each connector, which makes the above-described problems more pronounced. Moreover, since the inventions, disclosed in the respective publications, require tongue pieces or projections to be provided to a conductive member, applying the technique to a conductive member such as an electric wire (providing tongue pieces or projections) is difficult. Therefore, the present invention is made so as to provide a surface mount clip in which permanent deformation of resilient contact parts can be inhibited, and conductive members, such as a shielding case, an electric wire and so on, can be easily attached.

Means for Solving the Problems

The present invention that is made in order to achieve the above-described purpose provides a surface mount clip formed by bending a metallic thin plate, and including: a solder joint part in which a lower surface thereof is to be a solder joint surface to be soldered and connected to a conductor pattern on a printed circuit board, when the surface mount clip is mounted on an attachment surface of the printed circuit board; a pair of support parts connected to the solder joint part in a manner displaced in a direction of an upper surface of the solder joint part, and, when the solder joint part is soldered and connected to the printed circuit board, supported in a position above the printed circuit board at an interval between the pair of support parts, the interval allowing a conductive member other than the printed circuit board to be inserted therein; and a resilient contact part that is connected at least to one of the pair of support parts in a manner inclined toward the solder joint part, is resiliently deformed and pressed by the conductive member, when the conductive member is inserted between the pair of support parts, and electrically connects the conductor pattern and the conductive member by securing the conductive member between the pair of support parts.

In the surface mount clip configured according to the present invention, when the lower surface of the solder joint part is soldered and connected to the conductor pattern of the printed circuit board, the pair of the support parts, displaced in the direction of the upper surface of the solder joint part and connected to the solder joint part, are supported in a position above the printed circuit board at an interval between the pair of support parts, which allows the conductive member to be inserted therein. To at least one of the pair of support parts, the resilient contact part is connected in the manner inclined toward the solder joint part. The resilient contact part is resiliently deformed and pressed by the conductive member, when the conductive member is inserted between the pair of support parts, and secures the conductive member between the pair of support parts.

Therefore, using the surface mount clip according to the present invention enables to easily secure the conductive member to the printed circuit board by simply inserting the conductive member between the pair of support parts supported in the position above the printed circuit board. Moreover, the conductive member does not have to be provided with the tongue pieces and the like. Furthermore, the resilient contact part is connected to the support parts in the manner inclined toward the solder joint part (toward the printed circuit board). Therefore, even when external force is applied to the conductive member, lateral hitting by the conductive member with respect to the resilient contact part can be inhibited by the pair of support parts, which in turn can preferably inhibit permanent deformation of the resilient contact part.

The surface mount clip according to the present invention may include pluralities of the solder joint part, and the pair of support parts may each have one end, located in a direction perpendicular to a pressing direction of the resilient contact part, connected to one of the pluralities of the solder joint part, and another end connected to another of the pluralities of the solder joint part. In this case, since the pair of support parts, between which the conductive member is inserted, are respectively connected to one of the pluralities of solder joint part at one end of the pair of support parts, and connected to another of the pluralities of solder joint part at another end of the pair of support parts. The one end and the another end are ends in the direction perpendicular to the pressing direction of the resilient contact member. The pair of support parts can be more stably supported in the position above the printed circuit board. Therefore, the conductive member can be more easily secured to the printed circuit board, and permanent deformation of the resilient contact part can be more preferably inhibited.

In such case, the pair of support parts may be configured such that a void formed therebetween is gradually widened as a distance from the lower surfaces of the pluralities of the solder joint part becomes longer. Consequently, the conductive member can be more easily inserted between the pair of support parts.

Moreover in the surface mount clip according to the present invention, the pair of support parts may each have a shape extending from one pair of opposed sides of the solder joint part, bent toward the direction of the upper surface of the solder joint part, and further bent toward the lower surface of the solder joint part in a replicated form, a leading end of the replicated form may be located on an extension of the solder joint part, and the resilient contact part may be pressed by the conductive member from a direction perpendicular to the pair of opposed sides. In this case, the pair of support parts, each having a shape extending from one pair of opposed sides of the solder joint part, bent toward the direction of the upper surface of the solder joint part, and further bent toward the lower surface of the solder joint part in a replicated form, is connected to the solder joint part at one end, and soldered and connected to the printed circuit board at another end (the leading end). Therefore, the pair of support parts can be more stably supported in the position above the printed circuit board. As a result, the conductive member can be more easily secured to the printed circuit board, and permanent deformation of the resilient contact part can be more preferably inhibited.

Moreover, the surface mount clip according to the present invention may further include an auxiliary contact portion connected to the solder joint part in a manner displaced in the direction of the upper surface of the solder joint part in a degree smaller than the pair of support parts. The auxiliary contact portion may come in contact with the conductive member from a side of the printed circuit board, when the solder joint part is soldered and connected to the printed circuit board and the conductive member is inserted between the pair of support parts. In this case, when the solder joint part is soldered and connected to the printed circuit board, the auxiliary contact portion is supported in the position above the printed circuit board, and provided with some degree of spring property (resilience). In this state, when the conductive member is inserted between the pair of the support parts, the auxiliary contact portion comes in contact with the conductive member from the side of the printed circuit. Consequently, even if the conductive member is forcibly inserted between the pair of the support parts, application of the load on the printed circuit board can be inhibited. Moreover, even after securing the conductive member, the auxiliary contact portion is in contact with the conductive member from the side of the printed circuit board. Therefore, the electrical conduction between the conductive member and the conductor pattern of the printed circuit board can be more preferably ensured.

Moreover, the pair of support parts may each include a parallel support portion that is parallel to the solder joint part. The resilient contact part may be connected to an end edge (end edges) of the parallel support portions located in opposed side of the pair of the support parts.

In this case, each of the resilient contact part is configured by bending the thin plate, constituting the parallel support portion to which the resilient contact potion is connected, that is some portion of the pair of support parts parallel to the solder joint part, toward the solder joint part. Therefore, when the conductive member is inserted between the pair of support parts, force is applied, due to the insertion, to the resilient contact part toward a direction so as to increase the bending. In a case wherein force is applied, due to the insertion, in a direction so as to decrease the bending, that is, in a direction so as to recover the surface mount clip according to the present invention into an original thin-plate shape, the possibility increases for resilient contact part to be permanently deformed into a direction away from the conductive member. However, in the case of the present invention, the force is applied in the opposite direction. Therefore, permanent deformation of the resilient contact part can be preferably inhibited. Moreover, in this case, at least one portion of the thin plate between the pair of support parts can be used as a material for the resilient contact part, which in turn can reduce the materials necessary for manufacturing the surface mount clip.

BRIEF DESCRIPTION OF THE DRAWINGS

FIGS. 1A-1J are views showing a configuration of a surface mount clip according to Embodiment 1, FIG. 1A is showing a plan view, FIG. 1B is showing a left side view, FIG. 1C is showing a front view, FIG. 1D is showing a right side view, FIG. 1E is showing a bottom view, FIG. 1F is showing a left-top perspective view, FIG. 1G is showing a right-top perspective view, FIG. 1H is showing a left-bottom perspective view, FIG. 1I is showing a right-bottom perspective view, and FIG. 1J is showing a cross-sectional view taken along a line 1J-1J.

FIG. 2A is showing a plan view, FIG. 2B is showing a front view, FIG. 2C is showing a right side view, FIG. 2D is showing a right-top perspective view, and FIG. 2E is showing a cross-sectional view taken along a line 2E-2E.

FIGS. 3A-3J are views showing a configuration of a surface mount clip according to Embodiment 2, FIG. 3A is showing a plan view, FIG. 3B is showing a left side view, FIG. 3C is showing a front view, FIG. 3D is showing a right side view, FIG. 3E is showing a bottom view, FIG. 3F is showing a left-top perspective view, FIG. 3G is showing a right-top perspective view, FIG. 3H is showing a left-bottom perspective view, FIG. 3I is showing a right-bottom perspective view, and FIG. 3J is showing a cross-sectional view taken along a line 3J-3J.

FIGS. 4A-4J are views showing a configuration of a surface mount clip according to Embodiment 3, FIG. 4A is showing a plan view, FIG. 4B is showing a left side view, FIG. 4C is showing a front view, FIG. 4D is showing a right side view, FIG. 4E is showing a bottom view, FIG. 4F is showing a left-top perspective view, FIG. 4G is showing a right-top perspective view, FIG. 4H is showing a left-bottom perspective view, FIG. 4I is showing a right-bottom perspective view, and FIG. 4J is showing a cross-sectional view taken along a line 4J-4J.

FIGS. 5A-5J are views showing a configuration of a surface mount clip according to Embodiment 4, FIG. 5A is showing a plan view, FIG. 5B is showing a left side view, FIG. 5C is showing a front view, FIG. 5D is showing a right side view, FIG. 5E is showing a bottom view, FIG. 5F is showing a left-top perspective view, FIG. 5G is showing a right-top perspective view, FIG. 5H is showing a left-bottom perspective view, FIG. 5I is showing a right-bottom perspective view, and FIG. 5J is showing a cross-sectional view taken along a line 5J-5J.

FIGS. 6A-6I are views showing a configuration of a surface mount clip according to Embodiment 5, FIG. 6A is showing a plan view, FIG. 6B is showing a left side view, FIG. 6C is showing a front view, FIG. 6D is showing a right side view, FIG. 6E is showing a bottom view, FIG. 6F is showing a left-top perspective view, FIG. 6G is showing a right-top perspective view, FIG. 6H is showing a left-bottom perspective view, and FIG. 6I is showing a right-bottom perspective view.

FIG. 8A is showing a plan view, FIG. 8B is showing a left-top perspective view, FIG. 8C is showing a right-top perspective view, and FIG. 8D is showing a cross-sectional view taken along a line 8D-8D.

FIG. 9A is showing a plan view, FIG. 9B is showing a left side view, FIG. 9C is showing a front view, FIG. 9D is showing a right side view, FIG. 9E is showing a bottom view, FIG. 9F is showing a left-top perspective view, FIG. 9G is showing a right-top perspective view, FIG. 9H is showing a left-bottom perspective view, FIG. 9I is showing a right-bottom perspective view, and FIG. 9J is showing a cross-sectional view taken along a line 9J-9J.

Figure 2D:
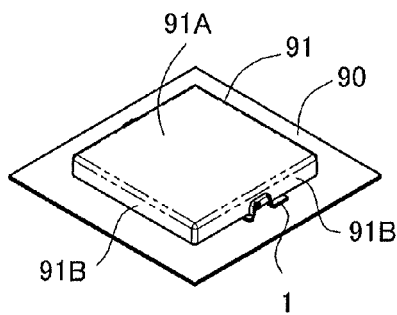
FIGS. 2A-2E are views showing a usage example of the surface mount clip.
Figure 2A:
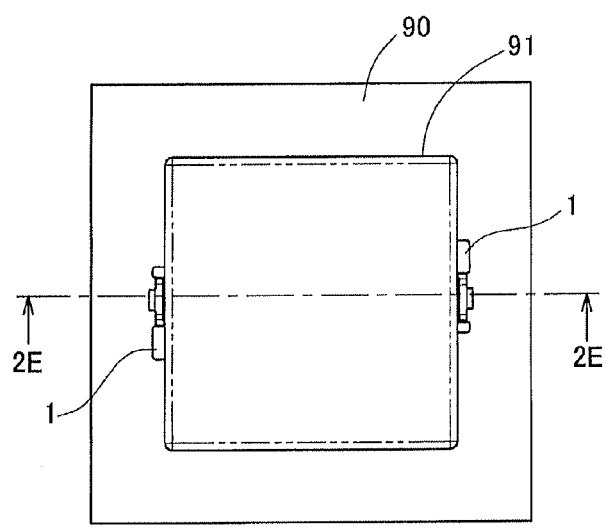
Figure 2C:
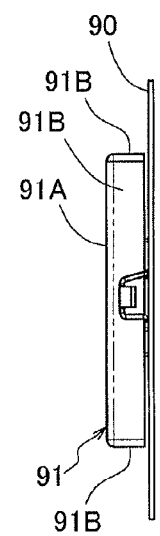
Figure 2B:
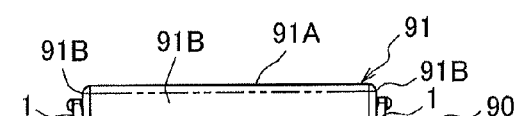

EXPLANATION OF REFERENCE NUMERALS 1, 21, 31, 41, 51, 61 . . . surface mount clip, 2, 3, 32B, 52 . . . solder joint part, 4, 5, 54, 55 . . . support part, 4A, 5A . . . parallel support portion, 4B, 4C, 5B, 5C . . . connecting portion, 6, 7, 56, 57, 66, 67 . . . resilient contact part, 32C . . . auxiliary contact portion, 90 . . . printed circuit board, 91 . . . shielding case, 91B . . . sidewall, 93 . . . solder, 97 . . . electric wire

MODE FOR CARRYING OUT THE INVENTION

Hereinafter, embodiments for carrying out the present invention will be described by way of examples with reference to the drawings. It is to be noted that the present invention is not limited to the examples to be described below, but can be carried out in various ways without departing from the scope of the present invention.

Embodiment 1

FIGS. 1A-1J are views showing a configuration of a surface mount clip 1 in Embodiment 1 according to the present invention. The surface mount clip 1 is formed by punching out a piece of thin plate, made of metal that can show spring property (for example, phosphor bronze, beryllium copper, SUS and so on), into a predetermined shape and bending the plate. The surface mount clip 1 is used in various postures corresponding to the posture of a printed circuit board 90 and the like to which the surface mount clip 1 is to be attached. In the following description, the near side in FIG. 1C may be referred to, for convenience, as the front side, the right side of the drawing may be referred to as the right side, and the upper side of the drawing may be referred to as the upper side.

As shown in FIGS. 1A-1J, the surface mount clip 1 includes two solder joint parts 2, 3 respectively having approximately rectangular shapes. Lower surfaces 2A, 3A of the solder joint parts 2, 3 correspond to solder joint surfaces, which will be explained later. The solder joint part 2 is larger than the solder joint part 3 in the front-to-rear direction (the longitudinal direction of the solder joint part 2). The dimensions of the solder joint parts 2, 3 in the left-to-right direction (the longitudinal direction of the solder joint part 3) are approximately the same. An upper surface 2B of the solder joint part 2 is a suction surface which is to be drawn by a suction nozzle (not shown) when an automatic mounting is performed.

A pair of support parts 4, 5 is laid between the solder joint part 2 and the solder joint part 3. The support parts 4, 5 respectively include parallel support portions 4A, 5A, connecting portions 4B, 5B, and connecting portions 4C, 5C. The connecting portions 4B, 5B are connected to one end of the solder joint part 2 in the front-to-rear direction (the longitudinal direction of the solder joint part 2) which is located in the side of the solder joint part 3, and extended in a slightly inclined manner in the front-to-rear direction (see for example, FIG. 1B, FIG. 1D). The connecting portions 4C, 5C are connected to one end of the solder joint part 3 in the front-to-rear direction which is located in the side of the solder joint parts 2, and extended in an approximately vertical direction (see for example, FIG. 1B, FIG. 1D). The parallel support portions 4A, 5A are extended between the upper ends of the connecting portions 4B, 5B and the upper ends of the connecting portions 4C, 5C. The heights of the upper ends of the connecting portions 4B, 5B and the heights of the upper ends of the connecting portions 4C, 5C are the same. The parallel support portions 4A, 5A are disposed such that the upper surfaces and the lower surfaces thereof are arranged parallel to the lower surfaces 2A, 3A.

To an outer side of the parallel support portion 4A (a side located in the opposite side of the parallel support portion 5A), a resilient contact part 6 is connected. The resilient contact part 6 is extended from the parallel support portion 4A, is bent back in an arc-like shape, and is provided with a portion extending in a downwardly-inclined manner. A leading end 6A of the resilient contact part 6 protrudes into the area between the support parts 4, 5.

To an outer side of the parallel support portion 5A (a side located in the opposite side of the parallel support portion 4A), a resilient contact part 7 is connected. The resilient contact part 7 is extended from the parallel support portion 5A, is bent back in an arc-like shape, and is provided with a portion extending in a downwardly-inclined manner. A leading end 7A of the resilient contact part 7 protrudes into the area between the support parts 4, 5.

It is to be noted that the resilient contact part 7 is larger than the resilient contact part 6. Moreover, the leading end 7A of the resilient contact part 7 is disposed below the leading end 6A of the resilient contact part 6. The leading end 6A and the leading end 7A are partly overlapped in the vertical direction (see FIG. 1C, FIG. 1J).

In the surface mount clip 1 constructed as above, the lower surfaces 2A, 3A of the solder joint parts 2, 3 are soldered and connected to a conductor pattern (not shown) of the printed circuit board 90, and the pair of the support parts 4, 5 connected to the solder joint parts 2, 3 are supported in a position above the printed circuit board 90.

FIGS. 2A-2E are views showing a usage example of the surface mount clip 1. FIGS. 2A-2E show an example in which a metallic shielding case 91 (an example of the conductive member) is secured to the printed circuit board 90. The shielding case 91 is constituted with a top panel 91A, having an approximately square shape, and a sidewall 91B, disposed in the periphery of the top panel 91A in a standing manner.

Figure 2E:
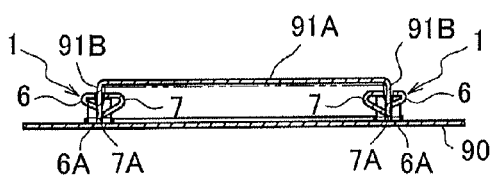

As shown in FIG. 2E, when the surface mount clip 1 is soldered and connected to the printed circuit board 90 as described above, the pair of support parts 4, 5 are supported in the position above the printed circuit board 90 at an interval between the pair of support parts 4, 5 so that the sidewall 91B can be inserted therein.

As described above, the leading ends 6A, 7A of the resilient contact parts 6, 7 protrude into the area between the support parts 4, 5 and partly overlap. Therefore, when the sidewall 91B is inserted between the support parts 4, 5, the resilient contact parts 6, 7 are pressed and contacted by the sidewall 91B, and the shielding case 91 is secured to the printed circuit board 90. Moreover, since the resilient contact parts 6, 7 protrude into the area between the support parts 4, 5 from the outer side of the parallel support portions 4A, 5A, reduction of the above-described contact pressure can be preferably inhibited while the surface mount clip 1 is used.

As described above, using the surface mount clip 1 according to Embodiment 1 enables to easily secure a conductive member, such as the sidewall 90B, to the printed circuit board 90 by simply inserting the conductive member between the pair of support parts 4, 5 supported in the position above the printed circuit board 90. Moreover, the above-described conductive member does not have to be provided with the tongue pieces and the like described in Patent Document 1. Furthermore, the resilient contact parts 6, 7 are connected to the parallel support portions 4A, 5A in the manner inclined toward the solder joint parts 2, 3 (toward the printed circuit board 90). Therefore, even when external force is applied to the above-described conductive member, the pair of support parts 4, 5 described above can inhibit lateral hitting of the conductive member with respect to the resilient contact parts 6, 7, which in turn can inhibit permanent deformation of the resilient contact parts 6, 7. As a result, the strength for securing a conductive member, such as the shielding case 91, to the printed circuit board 90 can be increased.

Moreover, in the surface mount clip 1 according to Embodiment 1, since the both ends of the support parts 4, 5 are respectively connected to the pair of the solder joint parts 2, 3, the support parts 4, 5 can be more stably supported in the positions above the printed circuit board 90. Furthermore, the support parts 4, 5 are made so as to have rigidity higher than rigidity of the resilient contact parts 6, 7. Therefore, the above-described conductive member can be more easily secured to the printed circuit board 90, and permanent deformation of the resilient contact parts 6, 7 can be more preferably inhibited.

Furthermore, the interval between the support parts 4, 5 is provided so as to be wider than the interval (width) of a conventional surface mount clip, which makes insertion of a conductive member easier. Therefore, the surface mount clip 1 can be made smaller than the conventional products, and the area that the surface mount clip 1 occupies can be reduced. Moreover, the weight of a device can be lighter. Furthermore, the manufacturing cost of the surface mount clip 1 can be reduced.

Moreover, the support parts 4, 5 are made so as to be easily deformed in the front-to-rear direction rather than in the left-to-right direction. When external force is applied to the shielding case 91, the sidewall 91B can, to some extent, slide laterally in the front-to-rear direction between the support parts 4, 5, and thereby the above-described external force can be absorbed. As a result, deformation of the support parts 4. 5 can be preferably inhibited.

Still furthermore, in Embodiment 1, the sidewall 91B of the shielding case 91 does not have to be provided with the tongue pieces in contrast to the above-described Patent Document 1. This not only reduces the manufacturing cost of an electronic device, but also brings the following effect. That is, in a case wherein tongue pieces are provided to the end edge of the sidewall 91B as described in Patent Document 1, possibility arises that high-frequency wave leaks from the gaps. Contrarily in Embodiment 1, the end edge of the sidewall 91B may simply be linear, which can more preferably inhibit leakage of high-frequency wave.

Embodiment 2

Next, FIGS. 3A-3J are views showing the structure of a surface mount clip 21 in Embodiment 2 according to the present invention. The surface mount clip 21 has a structure that resembles two of the surface mount clips 1 according to Embodiment 1 being connected to the solder joint part 2 so as to share the solder joint part 2. In FIGS. 3A-3J, the constituents configured in the same manner as in the surface mount clip 1 are provided with the same reference numerals as in Embodiment 1, and the detailed structural descriptions thereof are not repeated here.

In the surface mount clip 21 constructed as above, only one solder joint part 2 is required for two pairs of the support parts 4, 5 and resilient contact parts 6, 7. That is, while enough number of the support parts 4, 5 and the resilient contact parts 6, 7 can be ensured, the size of the parts or the number of the constituents can be reduced. For example, the shielding case 91 and the like can be more tightly secured by less number of the surface mount clips 21.

Embodiment 3

FIGS. 4A-4J are views showing the structure of a surface mount clip 31 in Embodiment 3 according to the present invention. The surface mount clip 31 is constructed differently from the surface mount clip 1 in the point that the solder joint part 2 is modified in the following manner. Other constituents are configured in the same manner as the surface mount clip 1. In FIGS. 4A-4J, the constituents configured in the same manner as in the surface mount clip 1 are provided with the same reference numerals as in FIGS. 1A-1J, and detailed structural descriptions thereof are not repeated here.

As shown in FIGS. 4A-4J, the connecting portions 4B, 5B are connected to a solder joint part 32B. A lower surface 32A of the solder joint part 32B constitutes a solder joint surface. To the solder joint part 32B, an auxiliary contact portion 32C is connected via a connecting portion 32D. The auxiliary contact portion 32C is disposed in a position above the solder joint parts 32B, 3. This configuration is achieved due to the connecting portion 32D extending in an inclined manner. The auxiliary contact portion 32C is disposed parallel to the solder joint parts 32B, 3.

It is to be noted that, although the width of the solder joint part 2 in the left-to-right direction (in the direction of the short side of the solder joint part 2) is made slightly larger than the width of the solder joint part 3 in the left-to-right direction (in the longitudinal direction of the solder joint part 3) in the surface mount clip 1 according to Embodiment 1, the widths of the solder joint part 32B, the connecting portion 32D, and the auxiliary contact portion 32C in the left-to-right direction (in the direction of the short side of the auxiliary contact portion 32C) are made so as to be equivalent to the width of the solder joint part 3 in the left-to-right direction (in the longitudinal direction of the solder joint part 3) in the surface mount clip 31 according to Embodiment 3.

In a case wherein such auxiliary contact portion 32C is provided, when the solder joint parts 32B, 3 are soldered and connected to the printed circuit board 90, the auxiliary contact portion 32C is supported in a position above the printed circuit board 90. Then, the entire portion of the connecting portion 32D and the auxiliary contact portion 32C is provided with some degree of spring property (resilience).

When a conductive member, such as the shielding case 91, is inserted between the pair of the support parts 4, 5, the bottom end of the shielding case 91 comes in contact with the auxiliary contact portion 32C. In other words, the auxiliary contact portion 32C comes in contact with the shielding case 91 (conductive member) from the side of the printed circuit 90.

In this case, even if the shielding case 91 (conductive member) is forcibly inserted between the pair of the support parts 4, 5, application of the load on the printed circuit board 90 can be inhibited. Moreover, even after securing the shielding case 91 (conductive member), the auxiliary contact portion 32C is in contact with the shielding case 91 (conductive member) from the side of the printed circuit board 90. Therefore, the electrical conduction between the shielding case 91 (conductive member) and the conductor pattern of the printed circuit board 90 can be more preferably ensured.

Embodiment 4

FIGS. 5A-5J are views showing the structure of a surface mount clip 41 in Embodiment 4 according to the present invention. The surface mount clip 41 is constructed differently from the surface mount clip 1 according to Embodiment 1 in the point that the resilient contact part 6 is omitted, and that the structure of the support parts 4, 5 is modified in the following manner. Other constituents are configured approximately in the same manner as the surface mount clip 1. Therefore, in FIGS. 5A-5J, the constituents configured in the same manner as in the surface mount clip 1 are provided with the same reference numerals as in FIGS. 1A-1J, and detailed structural descriptions thereof are not repeated here.

As shown in FIG. 5J, even though the resilient contact part 6 is omitted, a conductive member, such as the sidewall 91B of the shielding case 91 (see FIGS. 2A-2E), can be secured by the resilient contact part 7 pressing the conductive member against the support part 4. Moreover, in Embodiment 4, the pair of the support parts 4, 5 are beveled in the vicinity of the parallel support portions 4A, 5A so that the void therebetween is widened as the distance from the solder joint parts 2, 3 becomes longer. As a result, the above-described conductive member can be more easily inserted between the pair of the support parts 4, 5. It is to be noted that the widths of the solder joint parts 2, 3 in the left-right direction are made to be equivalent in Embodiment 4 as well as in Embodiment 3.

Embodiment 5

FIGS. 6A-6I are views showing the structure of a surface mount clip 51 in Embodiment 5 according to the present invention. As shown in FIGS. 6A-6I, in the surface mount clip 51 according to Embodiment 5, a solder joint part 52 is divided into a suction portion 52C and a base portion 52D.

A lower surface 52A constitutes a solder joint surface, whereas an upper surface 52B constitutes a suction surface to be drawn by a suction nozzle, which is not shown in the drawing. To the base portion 52D, support parts 54, 55 are connected. It is to be noted that the suction portion 52C and the base portion 52D are connected, and the connecting portions thereof are bound in the left-to-right direction.

The pair of the support parts 54, 55 in Embodiment 5 are, as shown in FIG. 6C, have loop-like shapes in the front view. The support parts 54, 55 each includes: a portion extending from one pair of opposed sides of the base portion 52D in a manner inclined toward above the solder joint part 52; a portion curved in an arc-like shape so as to be replicated; and a portion extending approximately in the vertical direction. Leading ends 54A, 55A of the support parts 54, 55 are located at approximately the same height as the solder joint part 52 (located on an extension of the solder joint part 52).

On the inner lateral surfaces of the support parts 54, 55, rectangular concave portions 54C, 55C are provided, and the resilient contact parts 56, 57 respectively run through the concave portions 54C, 55C. The resilient contact parts 56, 57 are formed by cutting the outer lateral surfaces of the support parts 54, 55 from the side of the leading ends 54A, 55A.

It is to be noted that, in the front view, the support parts 54, 55 have loop-like shapes gradually expanded in the left-to-right direction toward the upper side thereof (see FIG. 6C). The resilient contact parts 56, 57 are, as shown, for example, in FIG. 6C, cut and raised in the vicinity of the upper ends of the support parts 54, 55 and inclined toward the inner-lower side so that the leading ends 56A, 57A protrude into the area between the support parts 54, 55.

Figure 7:
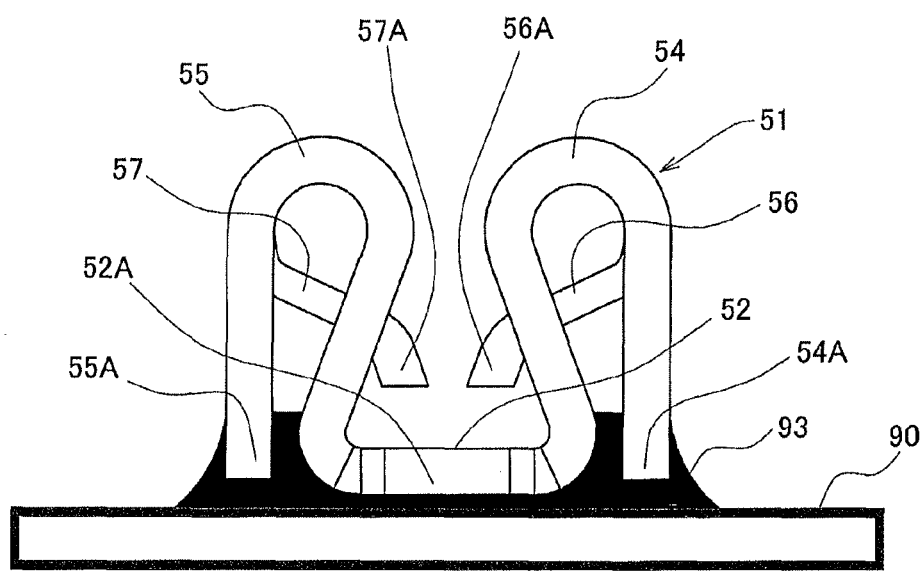
FIG. 7 is a front view showing an example of attaching the surface mount clip to a printed circuit board.

FIG. 7 is a front view showing a state wherein the surface mount clip 51 is secured to the printed circuit board 90. As described above, the leading ends 54A, 55A of the support parts 54, 55 are located at approximately the same height as the solder joint part 52 (located on an extension of the solder joint part 52). When the lower surface 52A is soldered and connected to the printed circuit board 90 by the solder 93, the solder 93 is also formed in the gap and the like between the solder joint part 52 and the leading ends 54A, 55A (in other words, in the peripheries of the leading ends 54A, 55A), which makes the support parts 54, 55 work as strong walls. As a result, permanent deformation of the resilient contact parts 56, 57 can be preferably inhibited, and the strength of securing a conductive member, such as the shielding case 91, to the printed circuit board 90 can be increased in Embodiment 5 as well as in each of the above-described embodiments. Moreover, the interval between the support parts 54, 55 is provided so as to be wider than the interval (width) of a conventional surface mount clip, which makes insertion of a conductive member easier. Therefore, the surface mount clip 51 can be made smaller than the conventional products, and the area that the surface mount clip 51 occupies can be reduced. Moreover, the weight of the device can be lighter. Furthermore, the manufacturing cost of the surface mount clip 51 can be reduced.

Figure 8D:
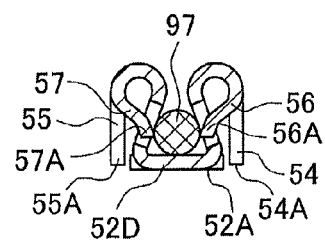
FIGS. 8A-8D are views showing a state, in which an electric wire is secured to the surface mount clip.
Figure 8B:
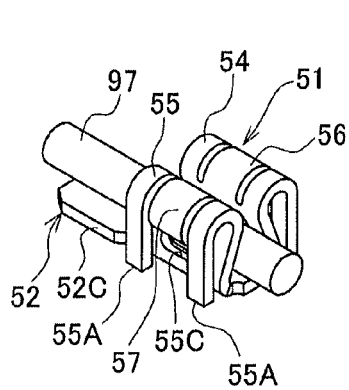
Figures 8A, 8C:
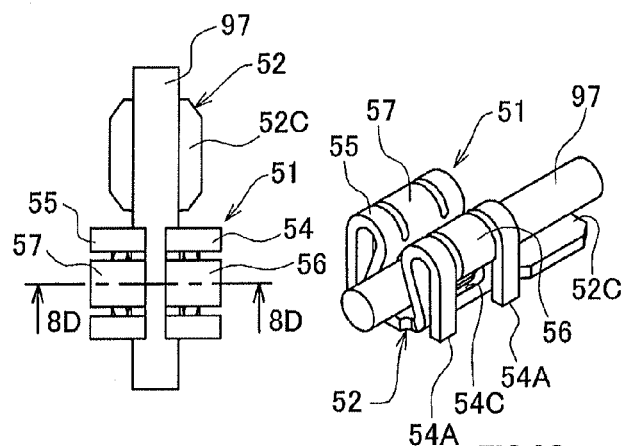

Moreover, since the surface mount clip 51 according to Embodiment 5 is configured such that, as described above, the vicinity of the upper ends of the support parts 54, 55 are gradually expanded, a conductive member, such as an electric wire 97, can be also inserted and secured between the expanded portions and the resilient contact parts 56, 57 as shown in the plan view in FIG. 8A, the left-top perspective view in FIG. 8B, the right-top perspective view in FIG. 8C, and the cross-sectional view cut along the line 8D-8D in FIG. 8D.

Embodiment 6

FIGS. 9A-9J are views showing the structure of a surface mount clip 61 in Embodiment 6 according to the present invention. The surface mount clip 61 is constructed differently from the surface mount clip 1 in Embodiment 1 in the point that the structures of the resilient contact parts 6, 7 and the support parts 4, 5 are modified in the following manner. Other constituents are configured approximately in the same manner as the surface mount clip 1. Therefore, in FIGS. 9A-9J, the constituents configured in the same manner as in the surface mount clip 1 are provided with the same reference numerals as in FIGS. 1A-1J, and detailed structural descriptions thereof are not repeated here.

Similarly to Embodiment 4, the pair of the support parts 4, 5 in Embodiment 6 are beveled in the vicinity of the parallel support portions 4A, 5A so that the void therebetween is widened as the distance from the solder joint parts 2, 3 becomes longer. As a result, a conductive member can be more easily inserted between the pair of the support parts 4, 5. It is to be noted that the widths of the solder joint parts 2, 3 in the left-to-right direction are made to be equivalent in Embodiment 6 as well as in Embodiments 3 and 4.

Figure 9J:
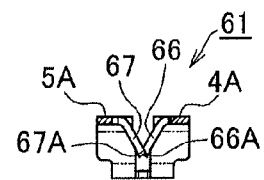
FIGS. 9A-9J are views showing a configuration of a surface mount clip according to Embodiment 6.
Figure 9F:
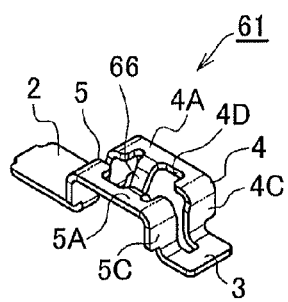
Figure 9A:
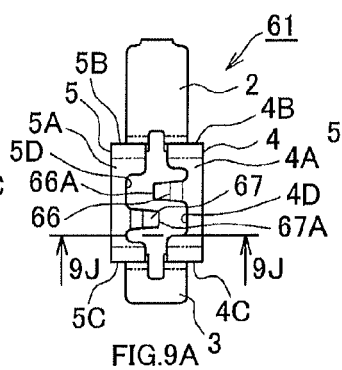
Figure 9G:
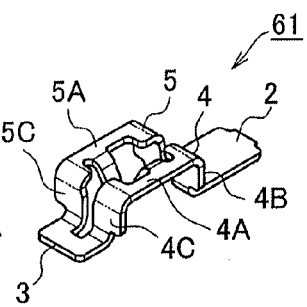
Figure 9B:
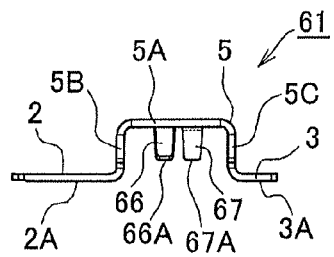
Figure 9C:
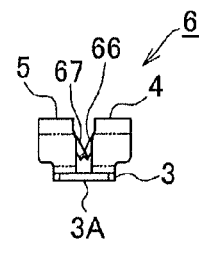
Figure 9D:
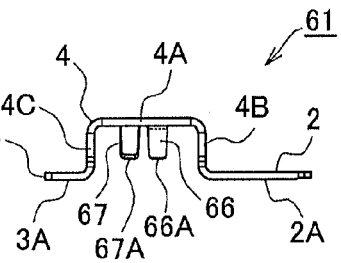
Figure 9H:
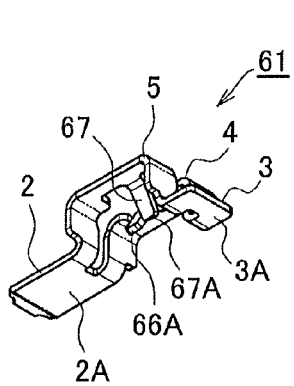

Moreover, in Embodiment 6, the configuration is made such that the width of the combination of the support parts 4 and 5 in the left-to-right direction becomes slightly larger than the width of the solder joint parts 2, 3 in the left-to-right direction. In the side of the parallel support portion 4A of the support part 4 which faces the parallel support portion 5A, a resilient contact part 66 and a notch 4D are formed. In the side of the parallel support portion 5A of the support part 5 which faces the parallel support portion 4A, a resilient contact part 67 and a notch 5D are formed. The resilient contact part 66 and the notch 5D correspondingly face each other, whereas the resilient contact part 67 and the notch 4D correspondingly face each other. As a result, the positions of the resilient contact parts 66, 67 are displaced with respect to each other in the front-to-rear direction, as shown in FIG. 9A.

Consequently, in the surface mount clip 61 according to Embodiment 6, the lengths of the resilient contact parts 66, 67 (the length from the base ends attached to the parallel support portions 4A, 5A to the leading ends 66A, 67A) can be ensured so as to be as long as the combination of the interval between the parallel support portions 4A, 5A and the depths of the notches 4D, 5D. Therefore, when the surface mount clip 61 is made by punching out from a piece of thin plate as described above, the portion of the above-described thin plate between the support parts 4, 5 can be used as a material for the resilient contact parts 66, 67, which in turn can reduce the materials necessary for manufacturing the surface mount clip 61.

Figure 9E:
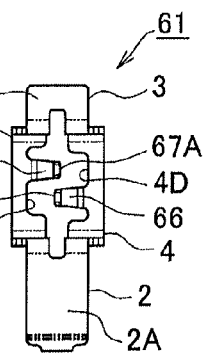
Figure 9I:
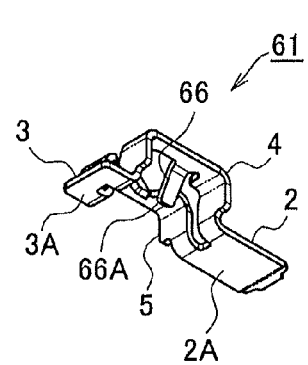

Moreover, the resilient contact parts 66, 67 are bent and declined toward below the parallel support portions 4A, 5A so that the leading ends 66A, 67A thereof protrude into the area between the support parts 4, 5, and are partly overlapped in the front-to-rear direction (see FIG. 9A, and FIG. 9E). Therefore, also in Embodiment 6, a conductive member, such as the sidewall 91B of the shielding case 91 (see FIGS. 2A-2E), can be secured by pressing the resilient contact parts 66, 67 against the conductive member.

In Embodiment 6, the resilient contact parts 66, 67 are respectively configured by downwardly (toward the solder joint parts 2, 3) bending the above-described thin plate constituting the parallel support portions 4A, 5A. Therefore, when a conductive member, such as the sidewall 91, is inserted between the support parts 4, 5, force is applied, due to the insertion, to the respective resilient contact parts 66, 67 toward a direction so as to increase the above-described bending. In a case wherein force is applied, due to the insertion, in a direction so as to decrease the above-described bending, that is, in a direction so as to recover a surface mount clip into an original thin-plate shape, the possibility increases for resilient contact parts to be permanently deformed into a direction away from the conductive member. In Embodiment 6, the force is applied in the opposite direction. Therefore, permanent deformation of the resilient contact parts 66, 67 can be preferably inhibited.

Furthermore, in Embodiment 6, the resilient contact part 66 is connected to the end edge of the side of the support part 5 of the notch 4D of the parallel support portion 4A, and the resilient contact part 67 is connected to the end edge of the side of the support part 4 of the notch 5D of the parallel support portion 5A. Therefore, the support parts 4, 5 can preferably inhibit, to a large extent, permanent deformation of the resilient contact parts 66, 67 which may be caused by the above-described conductive member laterally hitting the resilient contact parts 66, 67.

The invention claimed is:

1. A surface mount clip formed by bending a metallic thin plate, and the surface mount clip comprising:
    a solder joint part in which a lower surface thereof is to be a solder joint surface to be soldered and connected to a conductor pattern on a printed circuit board, when the surface mount clip is mounted on an attachment surface of the printed circuit board;
    a pair of support parts spaced from one another and extending from the solder joint part in an upward direction from an upper surface of the solder joint part, and the pair of support parts extending parallel but displaced from one another such that when the solder joint part is soldered and connected to the printed circuit board, an interval formed between the pair of support parts, allows a conductive member, other than the printed circuit board, to be inserted therein; and
    a resilient contact part that is connected at least to one of the pair of support parts in a manner inclined toward the solder joint part, is resiliently deformed and pressed by the conductive member, when the conductive member is inserted between the pair of support parts, and electrically connects the conductor pattern and the conductive member by securing the conductive member between the pair of support parts;
    wherein the pair of support parts each comprises a parallel support portion disposed in parallel to the soldered joint part; and
    the pair of support parts each having first end, located in a direction perpendicular to a pressing direction of the resilient contact part, directly connected to one of the pluralities of the solder joint parts, and an opposed second end directly connected to another of the pluralities of the solder joint parts.

2. The surface mount clip according to claim 1, wherein the pair of support parts is configured such that a void formed therebetween gradually widens as a distance from the lower surfaces of the pluralities of solder joint parts increases.

3. The surface mount clip according to claim 1 further comprising an auxiliary contact portion connected to the solder joint part in a manner displaced in the direction of the upper surface of the solder joint part by a smaller degree than the pair of support parts, the auxiliary contact portion coming in contact with the conductive member from a side of the printed circuit board, when the solder joint part is soldered and connected to the printed circuit board and the conductive member is inserted between the pair of support parts.

4. The surface mount clip according to claim 1, wherein the pair of support parts each includes a parallel support portion that is parallel to the solder joint part, and
the resilient contact parts are respectively connected to each end edge of the parallel support portions located in opposed sides of the pair of support parts.

5. A surface mount clip formed by bending a metallic thin plate, and the surface mount clip comprising:
a solder joint part in which a lower surface thereof is to be a solder joint surface to be soldered and connected to a conductor pattern on a printed circuit board, when the surface mount clip is mounted on an attachment surface of the printed circuit board;
a pair of support parts spaced from one another and extending from the solder joint part in an upward direction from an upper surface of the solder joint part, and the pair of support parts extending parallel but displaced from one another such that when the solder joint part is soldered and connected to the printed circuit board;
a spacing interval formed between the pair of support parts allowing a conductive member, other than the printed circuit board, to be inserted therein; and
a resilient contact part is connected at least to one of the pair of support parts in a manner inclined downward toward the solder joint part, the resilient contact part is resiliently deformed and pressed by the conductive member, when the conductive member is inserted between the pair of support parts, and electrically connects the conductor pattern and the conductive member by securing the conductive member between the pair of support parts;
wherein the pair of support parts each extend directly from one pair of opposed sides of the solder joint part, bent upward toward the direction of the upper surface of the solder joint part, and then is bent further downward toward the lower surface of the solder joint part in a replicated form, and a leading end of the replicated form being located on an extension of the solder joint part.

6. The surface mount clip according to claim 5 comprising a plurality of the solder joint parts,
wherein the pair of support parts each has one end, located in a direction perpendicular to a pressing direction of the resilient contact part, directly connected to one of the pluralities of the solder joint parts, and another end directly connected to another of the pluralities of the solder joint parts.

7. The surface mount clip according to claim 6, wherein the pair of support parts is configured such that a void formed therebetween gradually widens as a distance from the lower surfaces of the pluralities of solder joint parts increases.

8. The surface mount clip according to claim 5, wherein the resilient contact part is pressed by the conductive member from a direction perpendicular to the pair of opposed sides.

9. The surface mount clip according to claim 5 further comprising an auxiliary contact portion connected to the solder joint part in a manner displaced in the direction of the upper surface of the solder joint part in a degree smaller than the pair of support parts, the auxiliary contact portion comes into contact with the conductive member from a side of the printed circuit board, when the solder joint part is soldered and connected to the printed circuit board and the conductive member is inserted between the pair of support parts.

10. A surface mount clip formed by bending a metallic thin plate, and the surface mount clip comprising:
a solder joint part in which a lower surface thereof is to be a solder joint surface to be soldered and connected to a conductor pattern on a printed circuit board, when the surface mount clip is mounted on an attachment surface of the printed circuit board;
a pair of support parts extending upward from the solder joint part, and each of the pair of support parts extending parallel but spaced apart from one another;
a spacing interval, located between first facing sides of uppermost portions of the pair of support parts, allowing a conductive member, other than the printed circuit board, to be inserted therebetween;
a curved resilient contact part extending from a second side of the uppermost portion of one of the pair of support parts, and the resilient contact part being both bent downward toward the solder joint part and inward towards the spacing interval;
a leading end of each of the resilient contact part terminates at a height above the lower surface of the solder joint part and below the uppermost portions of the pair of support parts, such that when the conductive member is inserted in the spacing interval, between the pair of support parts, the resilient contact part is resiliently deformed and pressed upon by the conductive member, and electrically connects the conductor pattern and the conductive member by securing the conductive member between the pair of support parts.

* * * * *